United States Patent
Thomas

(10) Patent No.: US 8,648,741 B2
(45) Date of Patent: Feb. 11, 2014

(54) SYSTEMS AND METHODS FOR RANDOMIZING COMPONENT MISMATCH IN AN ADC

(71) Applicant: Linear Technology Corporation, Milpitas, CA (US)

(72) Inventor: David M. Thomas, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 13/671,151

(22) Filed: Nov. 7, 2012

(65) Prior Publication Data

US 2013/0113639 A1 May 9, 2013

Related U.S. Application Data

(60) Provisional application No. 61/556,440, filed on Nov. 7, 2011.

(51) Int. Cl.
*H03M 1/20* (2006.01)

(52) U.S. Cl.
USPC .......................................... 341/131; 341/155

(58) Field of Classification Search
USPC ......... 341/131, 135, 136, 120, 155, 159, 156, 341/154, 172
See application file for complete search history.

(56) References Cited

U.S. PATENT DOCUMENTS

| | | | |
|---|---|---|---|
| 5,493,298 A | 2/1996 | Bartz | |
| 6,456,223 B1 | 9/2002 | Yu et al. | |
| 6,784,814 B1 | 8/2004 | Nair et al. | |
| 7,277,033 B1 | 10/2007 | Kriz | |
| 2002/0067297 A1* | 6/2002 | Donovan et al. | 341/120 |
| 2004/0222912 A1 | 11/2004 | McMahill | |
| 2008/0272948 A1 | 11/2008 | Dabag et al. | |

OTHER PUBLICATIONS

Maxim, Application Note; "Understanding Pipelined ADCs;" Mar. 1, 2001.
E. Fogleman et al., "A Dynamic Element Matching Technique for Reduced-Distortion Multibit Quantization in Delta-Sigma ADCs," IEEE Transactions on Circuits and Systems—II: Analog and Digital Signal Processing, vol. 48, No. 2, Feb. 2001.
Kok Lim Chan, "High Speed, Hgih Resolution Digital-to-Analog Converters," dissertation, University of California, 2007.
Ian Galton, "Digital Cancellation of Dia Converter Noise in Pipelined A/D Converters," IEEE Transactions on Circuits and Systems—II: Analog and Digital Signal Processing, 47(3):185-196, Mar. 2000.
Robert M. Gray, "Dithered Quantizers," IEEE Transactions on Information Theory, 39(3):850-812 (1993).
Extended Search Report issued in European Patent Application No. 12007591.6 dated Mar. 13, 2013.

* cited by examiner

*Primary Examiner* — Joseph Lauture
(74) *Attorney, Agent, or Firm* — McDermott Will & Emery LLP

(57) ABSTRACT

Circuits and methods for converting a signal from analog to digital. A random number generator provides a random number to a memory. The memory is preconfigured to include codes of predetermined digital to analog (DAC) configurations that provide the maximum amount of DAC gradient suppression. At least one Flash reference generation DAC (FRGD) has an input coupled to the memory unit and an output providing a reference voltage level for its respective Flash comparator. The Flash comparators compare the analog input signal to their respective reference voltage and provide a digital output signal based on the comparison.

13 Claims, 2 Drawing Sheets

SYSTEMS AND METHODS FOR RANDOMIZING COMPONENT MISMATCH IN AN ADC

PRIORITY INFORMATION

The present application claims priority of provisional patent application No. 61/556,440 filed Nov. 7, 2011, the contents of which are incorporated herein in their entirety.

TECHNICAL FIELD

The disclosure generally relates to improving signal precision in view of component mismatches inherent in electronic circuitry. More particularly, the disclosure relates to systems and methods for normalizing the effects of component mismatches by randomizing interconnections among circuit components in DACs, thereby improving ADC linearity.

DESCRIPTION OF RELATED ART

Although real world signals are analog, it is often desirable to convert them to the digital domain using analog-to-digital converters (ADCs). Circuit designers are motivated to perform this conversion because of the efficient methods currently available for the transmission, storage and manipulation of digital signals. A digital representation of an audio signal, for example, allows a CD player to achieve virtually error free storage using optical discs. The need for complicated signal processing may also necessitate analog-to-digital conversion because such signal processing may only be feasible in the digital domain using either digital computers or special purpose digital signal processors.

One popular type of ADC includes the Flash or parallel ADC. This type of converter uses a linear voltage ladder with a comparator at each hierarchy of the ladder to compare the input voltage to successive reference voltages. Each comparator represents one LSB (least significant bit) of the ADCs digital output. If the input voltage common to all comparators is larger that the reference voltage for a given comparator, then the output of the comparator is true and all comparators connected to lower reference voltages are also true. The total number of comparators with true outputs represents the digital value of the analog input. These reference ladders may be constructed of a plurality of resistors. Other implementations may use capacitive voltage division.

High resolution Flash ADCs are not practical because of the need for $2^N-1$ comparators, where N is the resolution (i.e., number of bits) in the ADC. Sub-ranging and pipeline ADCs use two or more Flash ADCs to convert the analog signal in subsequent steps. This method may require substantially fewer comparators in comparison to a Flash ADC. However, this method may require additional precision hardware, which results in additional cost and circuit complexity.

For example, in a two-step, sub-ranging, N-bit ADC, the analog input signal is first digitized by a first K-bit Flash ADC, where K is the resolution (i.e., number of bits) in the first Flash ADC. The digital output of the first Flash ADC is then input to a K-bit DAC (reference DAC). The output of the DAC is then subtracted from the original analog input, resulting in a residue voltage. The residue voltage is the difference between the original analog input voltage and the estimate of the first K bit Flash ADC. The residue, which is a small portion of the original analog input, is then amplified and applied to the input of the second Flash ADC of (N−K) bits. The results of the two Flash ADCs are combined to yield the full N bit representation of the original analog input.

In the two-step, sub-ranging N-bit ADC example above, the linearity of the first K-bit Flash ADC generally has to be as accurate as the over-all N-bit ADC. Additionally, the offset of the residue amplifier generally has to have an offset that is substantially less than 1 LSB of the over-all ADC. Both of these requirements can be relaxed if the second Flash ADC has additional voltage range such that it can accommodate the expected errors. This additional range is often referred to as error correction range. For example if the residue amplifier is expected to have a maximum output offset of +/−200 mV (e.g., due to process variation) then the second Flash ADC typically has an additional 200 mV of range at the top and bottom of it's input voltage range.

In pipeline and sub-ranging analog to digital converters the linearity depends on the linearity of the reference DAC and the gain and linearity of the residue amplifier. The linearity of a DAC largely depends of the matching of the elements (e.g., switches and capacitors) within the DAC. For example, a 3-bit DAC may include 7 identical unit capacitors. Each capacitor has two terminals, a top plate and a bottom plate. All top plates are connected together and form the DAC output. Each bottom plate is connected to a switch that can switch between ground and a reference voltage. The digital input to the DAC controls the bottom plate switches. In this example, the linearity of the DAC depends on how closely each capacitor matches the other capacitors. Additionally, in sub-ranging ADCs the gain and linearity of the residue amplifier may also impact the linearity of the over-all ADC. Trimming and auto calibration can be used to improve matching, but these methods may not be enough to completely remove adverse effects of component mismatch.

Another approach that has been used to reduce linearity errors caused by mismatch errors is to shuffle the reference DAC elements (sometimes referred to as dynamic element matching (DEM)). For example, the electrical connection path between each Flash comparator and each reference DAC element is randomized. Accordingly, for a given ADC input voltage the number of DAC elements that are turned on in the reference DAC is always the same—but it is a randomly selected group of elements. By randomly selecting a given number of elements (or shuffling), mismatch errors appear as white noise instead of linearity errors. One drawback with component shuffling is that it requires additional hardware. This additional hardware typically results in slower operation as compared to non-shuffled circuitry.

FIG. 1 illustrates a pipeline stage with DAC element shuffling. In circuit 100 each digital output of the Flash ADC comparators 102 are coupled to a switch matrix 104. The outputs of the switch matrix 104 can be coupled to any one of the reference DAC capacitor elements 108. The time delay through the switch matrix 104 can be significant and thus contributes to slower system operation.

Circuit 100 of FIG. 1 shuffles DAC elements by shuffling the connection between the Flash comparator 102 output lines and the reference DAC switches 106. A similar result could be achieved by shuffling the connection between the Flash reference ladder 102 and the Flash comparator 110 reference inputs, as illustrated in FIG. 2.

In circuit 200 of FIG. 2, the reference voltages for the Flash are generated with a resistor ladder 202. A switch matrix 104 coupled between the reference resistor ladder 202 and the Flash comparators 110, allows any reference voltage to be provided to any Flash comparator 110. That is because the outputs of the switch matrix 104 can be coupled to any one of the Flash comparators 110. Although circuit 200 relieves the speed issue for the DAC, it introduces another complex switching matrix for the Flash converter. Accordingly, circuit 200 also results in slower operation.

There are numerous topologies for switch matrices but each has drawbacks. Topologies that provide simplified control typically suffer from high connection path resistance. Topologies that reduce connection path resistance generally require a high number of control lines. These drawbacks become more severe as the number of inputs and outputs increase. Indeed, it is often desirable for the first Flash converter in a sub-ranging ADC to have 4 or more bits of resolution, thereby requiring a switch matrix with at least 15 inputs and 15 outputs. For such a matrix, a simplified control topology may have 4 series switches with high capacitance intermediate nodes. The low resistance path topology requires 225 control lines and has high parasitic capacitance on both the input and output nodes.

In addition to speed problems, the shuffle methods proposed to date only address element match problems in the reference DAC. In this regard, other element match problems, such as residue amplifier gain error, which cause linearity errors of the same magnitude as the reference DAC matching, are not addressed.

Accordingly, in view of the foregoing, it would be desirable to provide systems and methods that overcome these and other drawbacks of the prior art.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Figure 1:
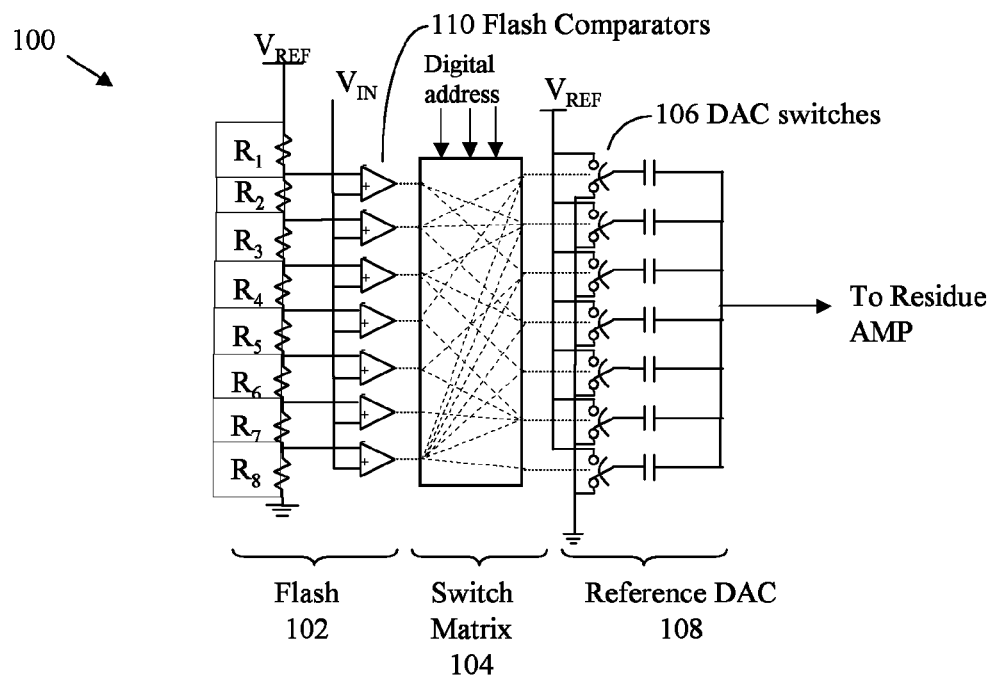
FIG. 1 illustrates a pipeline stage with DAC element shuffling with the switch matrix coupled between the Flash and the reference DAC.
Figure 2:
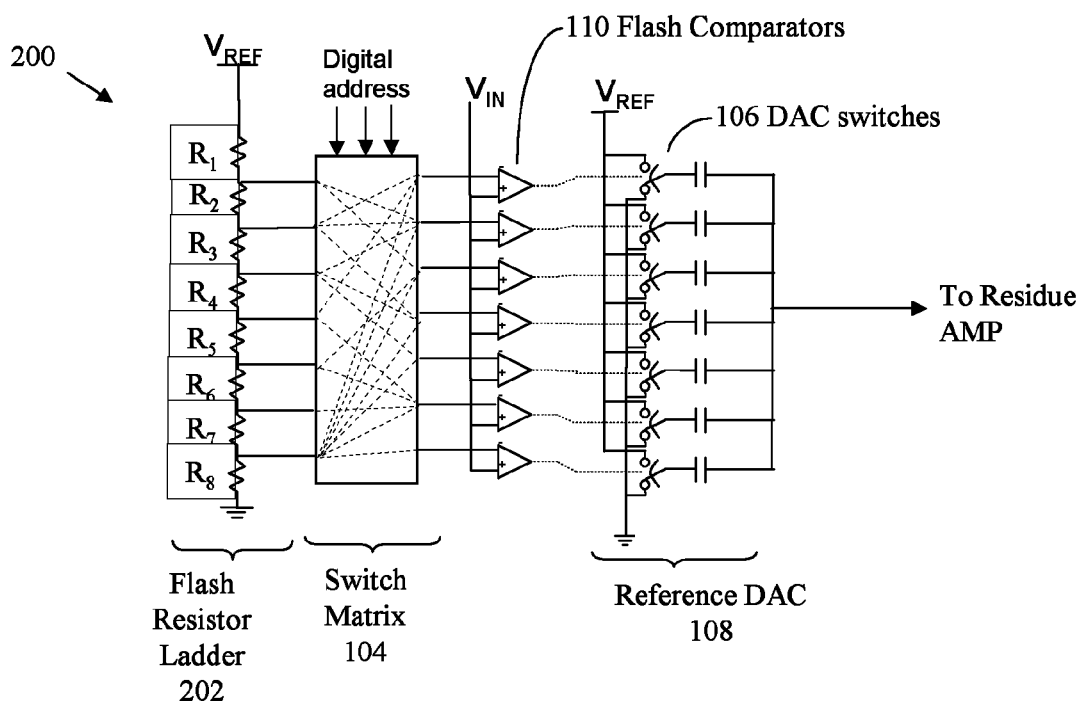
FIG. 2 illustrates a pipeline stage with the switch matrix coupled between the resistive ladder and the Flash comparators.
Figure 3:
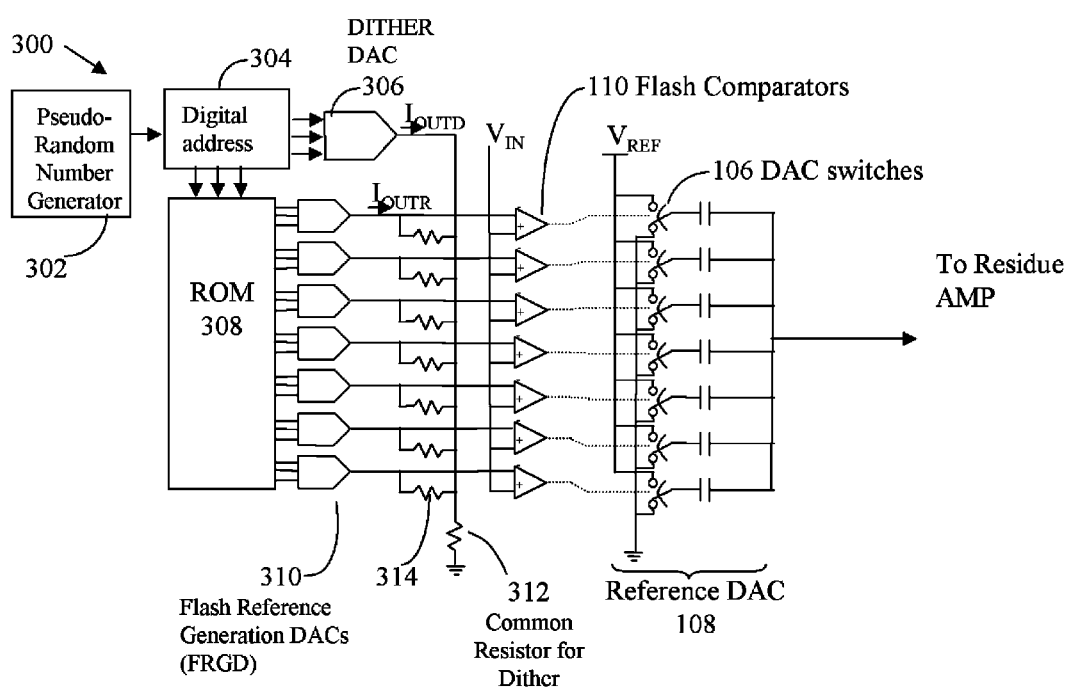
FIG. 3 is a schematic diagram of a DAC in accordance with an embodiment of the present invention.

FIG. 3 shows a schematic diagram of one stage of a pipeline analog to digital converter (ADC) in accordance with an exemplary embodiment of the present invention. As illustrated, circuit 300 includes a pseudo random number generator 302, a digital address circuit 304, a dither DAC 306, a memory unit (e.g., ROM) 308, Flash reference generation DACs (FRGDs) 310, resistors 314, common resistor for dither 312, Flash comparators 110, a reference DAC 108, and DAC switches 106.

The pseudo random number generator 302 generates a sequence of numbers that approximates the properties of random numbers. These random numbers are provided to digital address unit 304. The digital address unit 304 takes the random number and converts it to a memory address. For example, instead of providing the digital address based on the pseudo random number generator directly to the FLASH reference generation DACs (FRGD) 310, the random addresses are provided to a memory (e.g., ROM) 308.

To understand the benefit in using a memory in connection with FRGDs, it is instructive to discuss some contributors of DAC linearity errors and the resultant effect on ADC distortion errors. For example, in a capacitive DAC (CDAC) each capacitor element may have different capacitance due to process variation. These variations include random individual unit variations and systematic errors (or gradient errors). Gradient errors typically vary linearly or quadradically across the DAC element array, resulting in a gradient of DAC element values. Gradient errors are often larger in magnitude than random errors and thus may be more problematic. Additionally, because gradient errors are systematic, they may result in systematic DAC errors. As to random errors, they typically result in DAC errors that appear more random and are more noise like in nature. For example, if a DAC is used to generate a single tone sine wave, gradient type errors result in large error tones that may include second or third order harmonic distortion.

In one embodiment, the digital addresses produced by the pseudo random number generator 302 select an ordered set of codes stored in the ROM 308. These ordered sets of codes are then provided as inputs to the Flash reference generation DACs (FRGD) 310. The Flash reference generation DACs 310 provide a threshold voltage for each of the Flash comparators 110 in the Flash ADC. As a result, for a fixed input voltage (VIN) to the pipeline stage ADC 300 each ordered set of codes selected from the memory unit selects a different combination of the Reference DAC elements 108, while the total number of Reference DAC elements 108 switched to Vref or ground remains constant.

Some combinations of Reference DAC elements suppress systematic DAC errors due to gradient type errors better than others. In one embodiment, random combinations of ordered sets are tested for their ability to suppress typical process gradient errors through computer modeling. Over a course of many tests, (which may take months,) the best combinations (i.e., combinations that suppress gradient type errors) may be determined and programmed into the memory 308. For example, the ROM 308 may be programmed with 32 ordered sets of codes. These 32 ordered sets of codes may be the ordered sets of codes that result in the maximum amount of gradient error suppression (e.g., as determined by prior tests).

The integrity of an ADC may be tested by applying a pure sinusoidal input signal and then collecting a large number of digital output samples. In one example, the collection of samples are processed with a Fast Fourier Transform (FFT) to provide frequency domain results. Ideally, when the ADC has no errors, the resultant FFT should show only one tone, namely the original input signal. However, if the ADC has errors, other spurious tones will be present. For a sub-ranging ADC, typical DAC element gradient errors in the reference DAC have $2^{nd}$ and $3^{rd}$ order distortion tones.

By randomizing the selection of DAC element combinations used at each sample, the impact of distortion is decreased. In this regard, the randomization spreads the errors in the spectrum to appear as random noise. For example, by using DEM, the random sequence causes the DAC element gradient errors to appear as white noise rather than spurious tones. Without randomization, DAC element gradient errors result in spurious tones in an FFT spectrum. Through randomization, the detrimental energy is spread over the entire spectrum, resulting in a slightly elevated noise floor, which is generally preferred. Accordingly, DEM increases DAC linearity at the expense of slightly increasing the noise floor. In many applications, the tradeoff between better linearity at the expense of a slightly elevated noise floor is favorable.

In the example of FIG. 3, a 3-bit Flash ADC 310 drives a 3-bit Reference DAC 108. Current output reference generation DAC (FRGD) 310 generates the Flash ADC reference voltages across output resistors 314 for each of the Flash comparators 110. For example, a finite number of ordered sets of words for the FRGDs are stored in ROM 308. The ROM is addressed by a pseudo random number generator 302. Using a pseudo random number generator 302 helps ensure that no tones are produced in the ADC output while cycling through a finite number of FRGD words.

In one aspect, performance of the ADC is further improved by using dither. In one embodiment, the pseudo random number generator 302 (via the digital address unit 304) also drives a current output dither DAC 306. The dither DAC 306 output current $I_{OUTD}$ is fed into a resistor 312 that is common to all FRGD output resistors 314, thereby providing a dither signal to all comparators in the Flash ADC. A dither signal is a small amount of random noise (or pseudo random noise) that, when added to a periodic deterministic input, causes the quantization error of an ADC to behave like white noise. As mentioned earlier, DEM only randomizes the errors associated with the DAC elements. In one embodiment, errors associated with the residue amplifier or the second ADC (not shown) are not improved. For example, these other errors (e.g., errors from the residue amplifier or the second ADC) are due to the second or later step of the sub-ranging ADC. The error due to the second step is cyclic with respect to the input voltage and has $2^N$ cycles, where N is the number of bits in the first Flash ADC. By adding a dither signal to the first Flash ADC input the effective threshold of the comparators in the first Flash ADC is randomized. As result, the cyclical errors due to the second and later ADC steps are also randomized. This results in improved linearity at the expense of slightly elevated noise. In this regard, dither is similar in effect to the pseudo random number generator 302 in that it trades off distortion with a slightly elevated noise floor. However, dithering can be configured to operate at a finer scale.

In one embodiment, the Flash reference generation output DACs 310 (that may be low resolution current DACs) are driven into a respective resistor 314 to generate the reference voltages for each of the comparators 110. In one embodiment, each resistor 314 is directly connected to it's associated Flash comparator 110, thereby eliminating the parasitic resistance and capacitance associated with a switch matrix. Accordingly, the speed problem associated with the switch matrix of the prior art circuits is eliminated. Additionally, in one embodiment, another current output DAC 306 may be driven into a resistor 312 common to all reference generation DACs to provide a dither signal. This dither signal randomizes errors not associated with the reference DAC 108.

For example, a dither signal added to a Flash ADC input can be described as adding noise or offset to the ADC. As long as the error correction range of the second and later stages have enough error correction range to accommodate the added signal, the introduced dither signal does not significantly change the ADC result. In one embodiment, the dither amplitude is equal to the LSB size of the first Flash ADC. For such dither amplitude an additional correction range (e.g., equal to the nominal input range of the second step ADC) may be used. Additional correction range of this magnitude is difficult to implement due to the limited available voltage range in fine line processes. In one embodiment, the large error correction range is avoided by subtracting the dither voltage injected to the first pipeline Flash from the reference DAC 108. Put differently, the small amount of white noise added through dithering is subtracted at the output of the DAC 108.

Accordingly, circuit 300 provides reference DAC 108 shuffling and dithering that randomizes linearity errors due to component mismatch. The residual reference DAC 108 errors, as well as other ADC 300 errors, are substantially reduced.

Although preferred embodiments of the present invention have been disclosed with various circuits connected to other circuits, persons skilled in the art will appreciate that it may not be necessary for such connections to be direct and additional circuits may be interconnected between the shown connected circuits without departing from the spirit of the invention as shown. Moreover, although the invention has been illustrated herein in the context of analog-to-digital and digital-to-analog converters, it will be understood that it is applicable to any circuit in which determining component ratios or component measurement is desired.

Furthermore, although the invention has been illustrated using capacitors, it will be understood that other types of components such as inductors and resistors may be used if desired. Further still, although the embodiments herein have been described in the context of voltage signals, it will be understood that it is contemplated that in other embodiments these voltages signals may be replaced with current signals, charge signals, or other electrical energy signals (with the appropriate components) without departing from the spirit and scope of the present invention. Persons skilled in the art also will appreciate that the present invention can be practiced by other than the specifically described embodiments.

What is claimed is:

1. An analog to digital converter (ADC) circuit comprising:
   an ADC input for receiving an analog input signal;
   a memory having preconfigured ordered sets of codes;
   a digital sequence generator configured to provide random numbers to the memory;
   at least one Flash reference generation digital to analog converter (FRGD), each FRGD having an input coupled to the digital sequence generator and an output configured to provide a reference voltage level; and
   a Flash comparator for each of the at least one FRGD, each Flash comparator comprising:
      an output;
      a first input coupled to its corresponding FRGD; and
      a second input coupled to the ADC input;
   wherein the preconfigured ordered sets of codes of the memory are of predetermined FRGD combinations.

2. The circuit of claim 1, further comprising a reference digital to analog converter (DAC) comprising a switch and capacitor for each Flash comparator, wherein the reference DAC is coupled between each Flash comparator and a common output.

3. The circuit of claim 1, wherein the preconfigured ordered sets of codes are based on a predetermined number of FRGD combinations that provide a maximum DAC gradient suppression.

4. The circuit of claim 3, wherein the FRGD combinations that provide a maximum DAC gradient suppression are determined by computer modeling over a course of many tests.

5. The circuit of claim 1, further comprising a digital address circuit coupled between the digital sequence generator and the memory and configured to provide a memory address for each random number.

6. The circuit of claim 5, further comprising:
   an output resistor for each of the at least one FRGD, each output resistor having:

a first node coupled to its corresponding FRGD, and
a common resistor output;
a dither resistor coupled between the common resistor output and a reference voltage; and
a dither DAC having an output coupled to the common resistor output and configured to provide a dither signal.

7. The circuit of claim 6, further comprising a reference digital to analog converter (DAC) comprising a switch and capacitor for each Flash comparator, wherein:
the DAC is coupled between each Flash comparator and a common output; and
the ADC is a pipeline stage of a plurality of ADC's.

8. The circuit of claim 7, wherein an amplitude of the dither signal is equal to a least significant bit (LSB) of a prior stage ADC.

9. A method of converting an analog signal to a digital signal in a pipeline stage analog to digital converter (ADC) having an input, a memory, a digital sequence generator, at least one Flash reference generation digital to analog converter (FRGD), a plurality of Flash comparators, and a reference digital to analog converter (DAC) having several elements, the method comprising:
creating a random number;
sending the random number to the memory;
selecting a predetermined FRGD configuration based on the random number, thereby randomizing element mismatch in the reference DAC;
creating a threshold voltage for each Flash comparator based on the random number;
receiving an analog signal at the input;
comparing the analog signal with the respective threshold voltage by each Flash comparator;
providing a digital output signal by each Flash comparator based on the comparison.

10. The method of claim 9, further comprising:
determining FRGD combinations that provide a maximum DAC gradient suppression; and
programming the memory codes for only those FRGD combinations.

11. The method of claim 9, further comprising randomizing a residue generated by a prior stage ADC by providing a dither signal to the at least one Flash comparator.

12. The method of claim 11, wherein an amplitude of the dither signal is equal to a least significant bit (LSB) of a prior stage ADC.

13. The method of claim 11, further comprising subtracting a dither signal injected to a prior stage pipeline Flash from the reference DAC.

* * * * *